United States Patent
Hosogai et al.

(10) Patent No.: US 10,798,826 B2
(45) Date of Patent: Oct. 6, 2020

(54) POLYIMIDE LAMINATE FILM, METHOD FOR MANUFACTURING POLYIMIDE LAMINATE FILM, METHOD FOR MANUFACTURING THERMOPLASTIC POLYIMIDE, AND METHOD FOR MANUFACTURING FLEXIBLE METAL-CLAD LAMINATE

(71) Applicant: KANEKA CORPORATION, Osaka-shi (JP)

(72) Inventors: Seiji Hosogai, Otsu (JP); Hiroyuki Ushiro, Otsu (JP); Junpei Saito, Otsu (JP); Kazuhiro Ono, Otsu (JP)

(73) Assignee: KANEKA CORPORATION, Osaka-shi (JP)

( * ) Notice: Subject to any disclaimer, the term of this patent is extended or adjusted under 35 U.S.C. 154(b) by 7 days.

(21) Appl. No.: 15/562,619

(22) PCT Filed: Mar. 30, 2016

(86) PCT No.: PCT/JP2016/060439
§ 371 (c)(1),
(2) Date: Feb. 21, 2018

(87) PCT Pub. No.: WO2016/159106
PCT Pub. Date: Oct. 6, 2016

(65) Prior Publication Data
US 2018/0163005 A1  Jun. 14, 2018

(30) Foreign Application Priority Data
Mar. 31, 2015  (JP) .................. 2015-074445

(51) Int. Cl.
*B32B 15/08* (2006.01)
*B32B 27/28* (2006.01)
(Continued)

(52) U.S. Cl.
CPC ............. *H05K 3/022* (2013.01); *B29C 65/02* (2013.01); *B29C 66/45* (2013.01); *B29C 66/71* (2013.01);
(Continued)

(58) Field of Classification Search
CPC ......... B29C 65/02; B29C 66/45; B29C 66/71; B29C 66/74281; B29K 2679/085;
(Continued)

(56) References Cited

U.S. PATENT DOCUMENTS

| 4,420,535 A | 12/1983 | Walrath et al. |
| 4,904,758 A | 2/1990 | Kunimune et al. |

(Continued)

FOREIGN PATENT DOCUMENTS

| CN | 103680697 | 3/2014 |
| JP | 63159433 A * | 7/1988 |

(Continued)

OTHER PUBLICATIONS

Machine translation of JP 63-159433 (Year: 1988).*
(Continued)

*Primary Examiner* — John D Freeman
(74) *Attorney, Agent, or Firm* — Oblon, McClelland, Maier & Neustadt, L.L.P.

(57) ABSTRACT

A polyimide laminated film containing a thermoplastic polyimide layer that includes a block (A) having a storage elastic modulus of 0.15 GPa or more at 380° C. and a block (B) having a storage elastic modulus of 0.10 GPa or less at 380° C. is used as a polyimide laminated film that has high peel strength and can suppress occurrence of a crack in an alkaline environment.

13 Claims, 1 Drawing Sheet

(51) Int. Cl.
*H05K 3/02* (2006.01)
*B29C 65/02* (2006.01)
*B29C 65/00* (2006.01)
*B32B 15/20* (2006.01)
*B32B 27/08* (2006.01)
*B32B 37/18* (2006.01)
*H05K 1/03* (2006.01)
*B29K 679/00* (2006.01)
*B29L 31/34* (2006.01)
*H05K 1/02* (2006.01)
*H05K 3/46* (2006.01)

(52) U.S. Cl.
CPC ........ *B29C 66/74281* (2013.01); *B32B 15/08* (2013.01); *B32B 15/20* (2013.01); *B32B 27/08* (2013.01); *B32B 27/281* (2013.01); *B32B 37/182* (2013.01); *B29K 2679/085* (2013.01); *B29K 2995/0046* (2013.01); *B29L 2031/3425* (2013.01); *B32B 2307/51* (2013.01); *B32B 2311/12* (2013.01); *B32B 2379/08* (2013.01); *B32B 2457/08* (2013.01); *H05K 1/028* (2013.01); *H05K 1/036* (2013.01); *H05K 1/0393* (2013.01); *H05K 3/4655* (2013.01); *H05K 2201/0129* (2013.01); *H05K 2201/0154* (2013.01)

(58) Field of Classification Search
CPC ..... B29K 2995/0046; B29L 2031/3425; B32B 15/08; B32B 15/092; B32B 15/12; B32B 15/14; B32B 15/18; B32B 15/20; B32B 2250/03; B32B 2250/05; B32B 2250/40; B32B 2255/10; B32B 2255/26; B32B 2264/102; B32B 2264/104; B32B 2264/107; B32B 2270/00; B32B 2307/202; B32B 2307/302; B32B 2307/306; B32B 2307/51; B32B 2307/546; B32B 2307/714; B32B 2307/732; B32B 2307/746; B32B 2307/748; B32B 2307/752; B32B 2311/12; B32B 2379/08; B32B 2457/08; B32B 27/08; B32B 27/10; B32B 27/20; B32B 27/281; B32B 27/285; B32B 27/288; B32B 27/304; B32B 27/34; B32B 27/38; B32B 37/0053; B32B 37/06; B32B 37/182; B32B 37/203; B32B 5/022; B32B 7/04; B32B 7/06; B32B 7/12; C08G 81/00; C08J 2379/08; C08J 5/18; C08J 7/14; H05K 1/028; H05K 1/036; H05K 1/0373; H05K 1/0393; H05K 2201/0129; H05K 2201/0154; H05K 3/022; H05K 3/4655

See application file for complete search history.

(56) References Cited

U.S. PATENT DOCUMENTS

| 5,689,004 A | 11/1997 | Connell et al. |
| 2010/0096164 A1 | 4/2010 | Kikuchi et al. |

FOREIGN PATENT DOCUMENTS

| JP | 1-178522 A | 7/1989 |
| JP | 6-120659 A | 4/1994 |
| JP | 2000-119521 A | 4/2000 |
| JP | 2004-26944 A | 1/2004 |
| JP | 2009-132154 A | 6/2009 |
| JP | 2012-1701 A | 1/2012 |
| JP | 2012-186377 A | 9/2012 |
| JP | 2013-117015 A | 6/2013 |
| JP | 2014-40003 A | 3/2014 |
| TW | 201136765 | 11/2011 |
| TW | 201233715 A1 | 8/2012 |
| WO | WO 2008/114642 A1 | 9/2008 |

OTHER PUBLICATIONS

International Search Report dated Jul. 5, 2016 in PCT/JP2016/060439, 2 pages.
International Preliminary Report on Patentability and Written Opinion dated Oct. 12, 2017 in PCT/JP2016/060439, 7 pages.
Office Action dated Aug. 30, 2019, in Taiwanese patent application No. 105110184, w/ English translation (12 pages).
Third Office Action dated Dec. 31, 2019, in Chinese patent application No. 201680018954.2, (with partial translation).

* cited by examiner

US 10,798,826 B2

POLYIMIDE LAMINATE FILM, METHOD FOR MANUFACTURING POLYIMIDE LAMINATE FILM, METHOD FOR MANUFACTURING THERMOPLASTIC POLYIMIDE, AND METHOD FOR MANUFACTURING FLEXIBLE METAL-CLAD LAMINATE

TECHNICAL FIELD

The present invention relates to a polyimide laminated film that can be suitably used in a flexible metal clad laminate, a method for manufacturing the polyimide laminated film, a method for manufacturing a thermoplastic polyimide, and a method for manufacturing a flexible metal clad laminate.

TECHNICAL BACKGROUND

In recent years, there have been rapid advancements in high performance, high functionality and miniaturization of electronic devices, and along with this, there have been increased demands for miniaturization and weight reduction with respect to electronic components used in electronic devices. In response to the above demands, with respect to semiconductor element packaging methods and wiring boards on which semiconductor elements are mounted, a higher density, higher functionality, and higher performance are also required.

An important electronic component is a flexible printed wiring board (hereinafter, also referred to as an FPC). When an FPC is manufactured, in general, a flexible metal clad laminate is manufactured by using a flexible thin insulating film layer as a core film (hereinafter, also referred to as a base film or a base material) and pasting a metal foil layer to a surface of the core film via an adhesive layer composed of various adhesive materials by applying heat and pressure thereto. Further, a circuit pattern is formed on the flexible metal clad laminate and a cover layer (coverlay film) is formed a surface of the circuit pattern. Thereby, an FPC is manufactured.

In such a flexible printed wiring board formed of three layers including an insulating film layer, an adhesive layer and a metal foil layer (three-layer FPC), conventionally, as the insulating film layer, a polyimide film or the like is widely used. The reason for this is that the polyimide film has excellent heat resistance, electrical characteristics, and the like. As the adhesive layer, an epoxy resin-based thermosetting adhesive, an acrylic resin-based thermosetting adhesive, or the like is generally used. These thermosetting adhesives have an advantage that bonding is possible at a relatively low temperature. However, these thermosetting adhesives are poor in heat resistance, and further, as characteristics such as flexibility and electrical reliability that are required for a three-layer FPC become stricter, it is likely to be difficult for these thermosetting adhesives to be used in a three-layer FPC in which a thermosetting adhesive is used. In contrast, an FPC (hereinafter, also referred to as a two-layer FPC) is used in which a metal foil layer is directly provided on an insulating film layer or a thermoplastic polyimide film is used as an adhesive layer. The two-layer FPC has better characteristics than the three-layer FPC, ad it is expected that demand for the two-layer FPCs will further increase in the future. For the FPCs, in addition to the above-described characteristics of use, recently, demand for cost reduction has also increased. Therefore, the FPC manufacturing process is changing from a conventional batch type process (discontinuous process) to a roll-to-roll type process (hereinafter, also referred to as a continuous process).

RELATED ART

Patent Document

[Patent Document 1] Japanese Patent Laid-Open Publication No. Hei 06-120659 (published on Apr. 28, 1994).
[Patent Document 2] Japanese Patent Laid-Open Publication No. 2012-186377 (published on Sep. 27, 2012).
[Patent Document 3] International Publication No. WO 2008/114642 (published on Sep. 25, 2008).

SUMMARY OF THE INVENTION

Problems to Be Solved by the Invention

Although a two-layer FPC has such excellent characteristics, a new problem is also becoming obvious. A polyimide laminated film that is suitably used for a two-layer FPC has an adhesive layer that contains a thermoplastic polyimide layer on at least one side of a non-thermoplastic polyimide film that is a core film. When the polyimide laminated film is processed into an FPC, there is a process in which the polyimide laminated film is in contact with an aqueous alkali solution, and the polyimide laminated film is required to have alkali resistance. In a roll-to-roll type process, a larger load than that in a case of a conventional batch type process is applied to a polyimide laminated film. As a result, a problem becomes apparent that a crack occurs in the polyimide laminated film, which has not been observed in an alkali treatment in a conventional batch type process.

Conventionally, polyimides having controlled resistance against alkaline solutions used in processes such as development, etching and resist peeling have been reported (for example, Patent Documents 1 and 2). However, although these materials do not cause a problem in a conventional batch type FPC manufacturing process, they do cause a problem in a roll-to-roll type continuous FPC manufacturing process as described above, and a polyimide material in which a crack does not occur even after being subjected to such a process has not been provided so far.

Further, a technology is disclosed in which an adhesive layer laminated on a heat resistant polyimide film contains a thermoplastic polyimide, and the thermoplastic polyimide has crystallinity (Patent Document 3). However, the technology is related to moisture absorption solder resistance, and there is neither disclosure nor suggestion related to the above-described cracking under an alkaline condition.

An object of the present invention is to provide a polyimide laminated film having improved toughness in an alkaline environment and capable of suppressing occurrence of a crack caused by an alkaline environment when a flexible metal clad laminate is formed by providing a metal foil on the polyimide laminated film and further a flexible printed wiring board is continuously manufactured in a roll-to-roll type process. Further, another object of the present invention is to provide a polyimide laminated film having high peel strength.

Means for Solving the Problems

In view of the above-described situation, as a result of an intensive study in order to solve the above-described problem, the present inventors have found that the above-described problem can be solved by the following novel polyimide laminated film, and thus accomplished the present invention.

<1> A polyimide laminated film of the present invention includes a thermoplastic polyimide layer that includes a block (A) having a storage elastic modulus of 0.15 GPa or more at 380° C. and a block (B) having a storage elastic modulus of 0.10 GPa or less at 380° C.

<2> In the polyimide laminated film of the present invention, it is preferable that the block (A) be a block component that contains at least 4,4'-bis (4-aminophenoxy) biphenyl (BAPB) and 3,3',4,4'-biphenyltetracarboxylic dianhydride (BPDA), and the block (B) be a block component that contains at least a diamine of 2,2'-bis [4-(4-aminophenoxy) phenyl] propane (BAPP), and pyromellitic dianhydride (PMDA).

<3> The polyimide laminated film of the present invention preferably has a weight reduction rate of less than 2 weight % when immersed in an alkaline solution at 80° C. for 10 minutes.

<4> In the polyimide laminated film of the present invention, the thermoplastic polyimide layer preferably has a storage elastic modulus of 0.05 GPa or less at 380° C.

<5> A method for manufacturing a thermoplastic polyimide of the present invention includes a process of copolymerizing a block (A) having a storage elastic modulus of 0.15 GPa or more at 380° C. and a block (B) having a storage elastic modulus of 0.10 GPa or less at 380° C.

<6> A method for manufacturing a polyimide laminated film of the present invention includes a process of laminating a thermoplastic polyimide layer and a non-thermoplastic polyimide layer, the thermoplastic polyimide layer including a block (A) having a storage elastic modulus of 0.15 GPa or more at 380° C. and a block (B) having a storage elastic modulus of 0.10 GPa or less at 380° C.

<7> A method for manufacturing a flexible metal clad laminate of the present invention includes a process of laminating a polyimide laminated film and a metal foil, the polyimide laminated film containing a thermoplastic polyimide layer that includes a block (A) having a storage elastic modulus of 0.15 GPa or more at 380° C. and a block (B) having a storage elastic modulus of 0.10 GPa or less at 380° C.

<8> In the method for manufacturing a flexible metal clad laminate of the present invention, the lamination process is preferably performed using a thermal lamination method or a cast method.

Effect of the Invention

The polyimide laminated film of the present invention allows occurrence of a crack to be suppressed even during a roll-to-roll type continuous FPC manufacturing process.

The present invention allows a polyimide laminated film having high peel strength to be realized.

MODE FOR CARRYING OUT THE INVENTION

An embodiment of the present invention is described below. However, the present invention is not limited to this embodiment. The present invention is not limited to various structures described below. Various modifications are possible within the scope of the claims. Embodiments and examples obtained by appropriately combining technical means respectively disclosed in different embodiments and examples are also included in the technical scope of the present invention. Further, all of scientific literature and patent documents described in the present specification are incorporated by reference in the present specification. In the present specification, unless otherwise specified, "A-B" representing a numerical range means "A or more and B or less."

The present inventors have extensively studied molecular design of a polyimide in order to improve toughness of a polyimide laminated film in an alkaline environment and have found that an aggregate structure of a thermoplastic polyimide forming a thermoplastic polyimide layer provided in a polyimide laminated film exerts a significant influence on the toughness of the polyimide laminated film in an alkaline environment, and allows both the toughness and processing characteristics such as adhesiveness of a thermoplastic polyimide to be achieved. That the toughness of the polyimide laminated film in an alkaline environment can be improved by molecular design of a thermoplastic polyimide is first discovered by the present inventors.

The thermoplastic polyimide of the present invention is intended to have a glass transition temperature (Tg) in a range of 150° C.-350° C., the glass transition temperature (Tg) being determined from a peak top temperature of a loss factor (tan $\delta$) obtained by dividing a loss modulus by a storage elastic modulus, the loss modulus being measured using a dynamic viscoelasticity measuring device (DMA).

The non-thermoplastic polyimide in the present invention is intended to be a polyimide that generally is not softened and does not possess adhesiveness even when heated. More specifically, the non-thermoplastic polyimide in the present invention refers to a polyimide that, in a state of a film, allows the film to maintain its shape without wrinkling or stretching when the film is heated at 380° C. for 2 minutes.

(Polyimide Laminated Film)

A polyimide laminated film of the present invention includes a thermoplastic polyimide layer that includes a block (A) having a storage elastic modulus of 0.15 GPa or more at 380° C. and a block (B) having a storage elastic modulus of 0.10 GPa or less at 380° C.

In the present invention, storage elastic moduli of "the block (A)," "the block (B)," and "the thermoplastic polyimide containing the block (A) and the block (B)" can be measured using a dynamic viscoelasticity measuring device. First, a polyimide composed of the block (A) alone, a polyimide composed of the block (B) alone, and a polyimide obtained by copolymerizing the block (A) and the block (B), are separately manufactured. Films obtained from these polyimides are used as test specimens, and dynamic viscoelasticities of the test specimens are measured. Graphs are prepared in each of which values of dynamic viscoelasticities are plotted against values of temperatures, and values of dynamic viscoelasticities at 380° C. are read from the graphs. The values of dynamic viscoelasticities at 380° C. are respectively storage elastic moduli of "the block (A)," "the block (B)," and "the thermoplastic polyimide containing the block (A) and the block (B)" at 380° C.

In the present invention, the storage elastic modulus of the block (A) at 380° C. is preferably 0.15 GPa or more, and more preferably 0.16 GPa or more. When the storage elastic modulus of the block (A) at 380° C. is 0.15 GPa or more, a polyimide laminated film having excellent alkali resistance can be realized. When the polyimide laminated film of the present invention is immersed in an alkaline solution (pH13, for example, 3% aqueous sodium hydroxide solution) at 80° C. for 10 minutes, a weight reduction rate is preferably less than 2.0 weight % of a weight before the immersion. Such a polyimide laminated film has excellent alkali resistance.

Further, in the present invention, the storage elastic modulus of the block (B) at 380° C. is preferably 0.10 GPa or less, and more preferably 0.08 GPa or less. When the storage elastic modulus of the block (B) at 380° C. is 0.10 GPa or less, adhesion between the polyimide laminated film and a metal foil layer is excellent.

The storage elastic modulus of the thermoplastic polyimide layer of the present invention at 380° C. is preferably 0.05 GPa or less, and more preferably 0.04 GPa or less. When the storage elastic modulus of the thermoplastic polyimide layer at 380° C. is 0.05 GPa or less, adhesion between the polyimide laminated film and a metal foil layer is excellent.

(Thermoplastic Polyimide Layer)

The thermoplastic polyimide forming the thermoplastic polyimide layer can be manufactured using a method that includes a process in which the block (A) having a storage elastic modulus of 0.15 GPa or more at 380° C. and the block (B) having a storage elastic modulus of 0.10 GPa or less at 380° C. are copolymerized.

A method for obtaining a thermoplastic polyamic acid (hereinafter, also referred to as a polyamic acid) that becomes a precursor of the thermoplastic polyimide layer of the present invention is described.

(Raw Material Monomer of Thermoplastic Polyamic Acid)

As raw material monomers that allow a thermoplastic polyamic acid to be synthesized that becomes a precursor of the thermoplastic polyimide layer used in the present invention, as long as the block (A) having a storage elastic modulus of 0.15 GPa or more at 380° C. and the block (B) having a storage elastic modulus of 0.10 GPa or less 380° C. can be formed, commonly used aromatic diamine and aromatic acid dianhydride can be used.

In the following, monomers that form the block components of the thermoplastic polyimide of the present invention are described.

Examples of aromatic diamines that can be preferably used include 2,2'-bis [4-(4-aminophenoxy) phenyl] propane, 4,4'-diaminodiphenylpropane, 4,4'-diaminodiphenylmethane, 4,4'-diaminodiphenyl sulfide, 3,3'-diaminodiphenyl sulfone, 4,4'-diaminodiphenyl sulfone, 4,4'-oxydianiline (4,4'-diaminodiphenyl ether), 3,3'-oxydianiline, 3,4'-oxydianiline, 4,4'-diaminodiphenyldiethylsilane, 4,4'-diaminodiphenylsilane, 4,4'-diaminodiphenylethylphosphine oxide, 4,4'-diaminodiphenyl N-methylamine, 4,4'-diaminodiphenyl N-phenylamine, 1,4-diaminobenzene (p-phenylenediamine), bis {4-(4-aminophenoxy) phenyl} sulfone, bis {4-(3-aminophenoxy) phenyl} sulfone, 4,4'-bis (4-aminophenoxy) biphenyl, 4,4'-bis (3-aminophenoxy) biphenyl, 1,3-bis (3-aminophenoxy) benzene, 1,3-bis (4-aminophenoxy) benzene, 1,3-bis (3-aminophenoxy) benzene, 3,3'-diaminobenzophenone, 4,4'-diaminobenzophenone, 2,2-bis (4-aminophenoxyphenyl) propane, and the like. These can each be used alone or multiple of these can be used in combination.

Further, examples of compounds that can be preferably used as aromatic acid dianhydride include pyromellitic dianhydride, 2,3,6,7-naphthalenetetracarboxylic dianhydride, 3,3',4,4'-biphenyltetracarboxylic dianhydride, 1,2,5,6-naphthalenetetracarboxylic dianhydride, 2,2',3,3'-biphenyltetracarboxylic dianhydride, 3,3',4,4'-benzophenonetetracarboxylic dianhydride, 2,2',3,3'-benzophenonetetracarboxylic dianhydride, 4,4'-oxyphthalic acid dianhydride, 3,4'-oxyphthalic acid dianhydride, 2,2-bis (3,4-dicarboxyphenyl) propanoic acid dianhydride, 3,4,9,10-perylenetetracarboxylic dianhydride, bis (3,4-dicarboxyphenyl) propanoic acid dianhydride, 1,1-bis (2,3-dicarboxyphenyl) ethane dianhydride, 1,1-bis (3,4-dicarboxyphenyl) ethane dianhydride, bis (2,3-dicarboxyphenyl) methane acid dianhydride, bis (3,4-dicarboxyphenyl) ethanoic acid dianhydride, oxydiphthalic acid dianhydride, bis (3,4-dicarboxyphenyl) sulfonic acid dianhydride, p-phenylene bis (trimellitic acid monoester acid anhydride), ethylene bis (trimellitic acid monoester acid anhydride), bisphenol A bis (trimellitic acid monoester acid anhydride), and the like.

Examples of aromatic diamines that can be suitably used for the block (A) included in the thermoplastic polyimide layer of the present invention include 4,4'-bis (4-aminophenoxy) biphenyl, 4,4'-diaminodiphenyl ether, p-phenylenediamine, and the like. Further, examples of aromatic acid dianhydrides that can be suitably used for the block (A) included in the thermoplastic polyimide layer of the present invention include 3,3',4,4'-biphenyltetracarboxylic dianhydride, 3,3',4,4'-benzophenonetetracarboxylic dianhydride, 2,2',3,3'-benzophenonetetracarboxylic dianhydride, and the like.

Examples of aromatic diamines that can be suitably used for the block (B) included in the thermoplastic polyimide layer of the present invention include 2,2'-bis [4-(4-aminophenoxy) phenyl] propane, 4,4'-diaminodiphenyl ether, 1,3-bis (4-aminophenoxy) benzene, and the like. Further, examples of aromatic acid dianhydrides that can be suitably used for the block (B) included in the thermoplastic polyimide layer of the present invention include pyromellitic dianhydride, oxydiphthalic dianhydride, and the like.

In the present invention, among these aromatic diamines and aromatic acid dianhydrides, for developing a storage elastic modulus, it is particularly preferable that the block (A) and the block (B) are each formed by imidizing a polyamic acid that contains an aromatic diamine and an aromatic acid dianhydride described above, the block (A) being a block component containing at least 4,4'-bis (4-aminophenoxy) biphenyl (BAPB) and 3,3',4,4'-biphenyltetracarboxylic dianhydride (BPDA), and the block (B) being a block component containing at least a diamine of 2,2'-bis [4-(4-aminophenoxy) phenyl] propane (BAPP) and pyromellitic dianhydride (PMDA).

(Composition Ratio of Block (A) to Block (B))

A composition ratio ((amount of the block (A)):(amount of the block (B))) of the block (A) and the block (B) contained in the thermoplastic polyimide of the present invention is preferably in a range of (30 mol %:70 mol %)-(70 mol %:30 mol %).

(Solvent used during Manufacture of Thermoplastic Polyamic Acid)

As a solvent used during manufacture of a thermoplastic polyamic acid, any solvent capable of dissolving the thermoplastic polyamic acid can be used. However, amide-based solvents such as N,N-dimethylformamide, N,N-dimethylacetamide, N-methyl-2-pyrrolidone and the like can be preferably used, and N,N-dimethylformamide and N,N-dimethylacetamide can be particularly preferably used.

(Manufacture of Thermoplastic Polyamic Acid)

As a method for manufacturing the thermoplastic polyamic acid of the present invention, any commonly known method can be used as long as the method allows the thermoplastic polyimide and the thermoplastic polyimide layer to be formed, the thermoplastic polyimide including the block (A) and the block (B), and the thermoplastic polyimide layer including the block (A) having a storage elastic modulus of 0.15 GPa or more at 380° C. and the block (B) having a storage elastic modulus of 0.10 GPa or less at 380° C. For example, the thermoplastic polyamic acid can be manufactured by the following processes (a)-(c):

(a) a process in which an aromatic diamine and an aromatic acid dianhydride are caused to react with each other in an organic polar solvent in a state in which the aromatic diamine is excessive, and a prepolymer having amino groups at both terminals is obtained;

(b) a process in which an aromatic diamine having a structure different from that used in the process (a) is added to the organic polar solvent; and (c) a process in which an aromatic acid dianhydride having a structure different from that used in the process (a) is further added to the organic polar solvent such that the aromatic diamine and the aromatic acid dianhydride are present in substantially equimolar amounts in the entire process, and polymerization is performed.

Alternatively, the thermoplastic polyamic acid can be manufactured by the following processes (a)-(c):

(a) a process in which an aromatic diamine and an aromatic acid dianhydride are caused to react with each other in an organic polar solvent in a state in which the aromatic acid dianhydride is excessive, and a prepolymer having acid anhydride groups at both terminals is obtained;

(b) a process in which an aromatic acid dianhydride having a structure different from that used in the process (a) is added to the organic polar solvent; and (c) a process in which an aromatic diamine having a structure different from that used in the process (a) is further added to the organic polar solvent such that the aromatic diamine and the aromatic acid dianhydride are present in substantially equimolar amounts in the entire process, and polymerization is performed.

(Solid Component Concentration of Thermoplastic Polyamic Acid)

Solid component concentration of the thermoplastic polyamic acid is not particularly limited. However, when the solid component concentration is in a range of 5 weight %-35 weight %, a thermoplastic polyimide having a sufficient mechanical strength can be obtained.

(Composition of Thermoplastic Polyamic Acid)

Various additives such as a filler, a heat stabilizer, an antioxidant, an ultraviolet absorber, an antistatic agent, a flame retardant, a pigment, a dye, a fatty acid ester, an organic lubricant (for example, wax) can be added to the thermoplastic polyamic acid of the present invention.

(Non-Thermoplastic Polyimide)

The polyimide laminated film of the present invention can have the thermoplastic polyimide layer of the present invention on at least one side of a non-thermoplastic polyimide film. In the following, an example of a non-thermoplastic polyimide film used in the present invention is described.

An aromatic diamine used in manufacturing a non-thermoplastic polyimide that can be used in a non-thermoplastic polyimide film is not particularly limited. However, examples of the aromatic diamine include 2,2'-bis [4-(4-aminophenoxy) phenyl] propane, 4,4'-diaminodiphenylpropane, 4,4'-diaminodiphenylmethane, 4,4'-diaminodiphenyl sulfide, 3,3'-diaminodiphenyl sulfone, 4,4'-diaminodiphenyl sulfone, 4,4'-oxydianiline (4,4'-diaminodiphenyl ether), 3,3'-oxydianiline, 3,4'-oxydianiline, 4,4'-diaminodiphenyldiethylsilane, 4,4'-diaminodiphenylsilane, 4,4'-diaminodiphenylethylphosphine oxide, 4,4'-diaminodiphenyl N-methylamine, 4,4'-diaminodiphenyl N-phenylamine, 1,4-diaminobenzene (p-phenylenediamine), bis {4-(4-aminophenoxy) phenyl} sulfone, bis {4-(3-aminophenoxy) phenyl} sulfone, 4,4'-bis (4-aminophenoxy) biphenyl, 4,4'-bis (3-aminophenoxy) biphenyl, 1,3-bis (3-aminophenoxy) benzene, 1,3-bis (4-aminophenoxy) benzene, 1,3-bis (3-aminophenoxy) benzene, 3,3'-diaminobenzophenone, 4,4'-diaminobenzophenone, 2,2-bis (4-aminophenoxyphenyl) propane, and the like. These can each be used alone or multiple of these can be used in combination.

An aromatic acid dianhydride used in manufacturing the non-thermoplastic polyimide that can be used in the non-thermoplastic polyimide film is also not particularly limited. However, examples of the aromatic acid dianhydride include pyromellitic dianhydride, 2,3,6,7-naphthalenetetracarboxylic dianhydride, 3,3',4,4'-biphenyltetracarboxylic dianhydride, 1,2,5,6-naphthalenetetracarboxylic dianhydride, 2,2', 3,3'-biphenyltetracarboxylic dianhydride, 3,3',4,4'-benzophenonetetracarboxylic dianhydride, 2,2',3,3'-benzophenonetetracarboxylic dianhydride, 4,4'-oxyphthalic acid dianhydride, 3,4'-oxyphthalic acid dianhydride, 2,2-bis (3,4-dicarboxyphenyl) propanoic acid dianhydride, 3,4,9,10-perylenetetracarboxylic dianhydride, bis (3,4-dicarboxyphenyl) propanoic acid dianhydride, 1,1-bis (2,3-dicarboxyphenyl) ethane dianhydride, 1,1-bis (3,4-dicarboxyphenyl) ethane dianhydride, bis (2,3-dicarboxyphenyl) methane acid dianhydride, bis (3,4-dicarboxyphenyl) ethanoic acid dianhydride, oxydiphthalic acid dianhydride, bis (3,4-dicarboxyphenyl) sulfonic acid dianhydride, p-phenylene bis (trimellitic acid monoester acid anhydride), ethylene bis (trimellitic acid monoester acid anhydride), bisphenol A bis (trimellitic acid monoester acid anhydride), and the like.

A polyamic acid (hereinafter, also referred to as a non-thermoplastic polyamic acid) that is a precursor of a non-thermoplastic polyimide is obtained by mixing the above aromatic diamine and aromatic acid dianhydride at substantially equimolar amounts in an organic solvent and causing the aromatic diamine and the aromatic acid dianhydride to react with each other.

As the organic solvent used in manufacturing the non-thermoplastic polyamic acid, any solvent capable of dissolving the non-thermoplastic polyamic acid can be used. For example, amide-based solvents such as N,N-dimethylformamide, N,N-dimethylacetamide and N-methyl-2-pyrrolidone can be preferably used, and N,N-dimethylformamide and N,N-dimethylacetamide can be more preferably used. Solid component concentration of the non-thermoplastic polyamic acid is not particularly limited. However, when the solid component concentration is in a range of 5 weight %-35 weight %, a non-thermoplastic polyimide film having a sufficient mechanical strength can be obtained.

An order of adding the aromatic diamine and the aromatic acid dianhydride, which are row materials, is also not particularly limited. However, by controlling not only chemical structures of the raw materials but also the order of adding the raw materials, characteristics of the resulting non-thermoplastic polyimide can be controlled.

A filler can be added to the non-thermoplastic polyamic acid for a purpose of improving various characteristics of the film such as slidability, thermal conductivity, electrical conductivity, corona resistance, and loop stiffness. Any filler may be used. However, preferred examples thereof include silica, titanium oxide, alumina, silicon nitride, boron nitride, calcium hydrogen phosphate, calcium phosphate, mica and the like.

Further, to an extent that characteristics of the resulting non-thermoplastic polyimide film or polyimide laminated film are not impaired, a thermosetting resin such as an epoxy resin or a phenoxy resin, and a thermoplastic resin such as polyether ketone or polyether ether ketone, may be mixed with the non-thermoplastic polyamic acid. As a method for adding these resins, there is a method in which, when the resins are soluble in a solvent, the resins are added to the polyamic acid, which is a precursor of the non-thermoplastic polyimide. When a polyimide is also soluble in a solvent, the resins may also be added to a polyimide solution. When the resins are insoluble in a solvent, there is a method in which the polyamic acid, which is a precursor of the non-thermoplastic polyimide, is first imidized and thereafter a polyimide and the resins are combined by melt-kneading. However, since there is a possibility that a solder heat resistance, a heat shrinkage rate and the like of a resulting flexible metal clad laminate may deteriorate, in the present invention, it is desirable not to use a meltable polyimide. Therefore, it is desirable to use a soluble resin as a resin to be mixed with the polyimide.

(Manufacture of Non-Thermoplastic Polyimide Film)

A method for manufacturing the non-thermoplastic polyimide film preferably include the following processes:

(i) a process in which an aromatic diamine and an aromatic tetracarboxylic acid dianhydride are caused to react with each other in an organic solvent to obtain a non-thermoplastic polyamic acid solution;

(ii) a process in which a film-forming dope containing the non-thermoplastic polyamic acid solution is cast from a die onto a support to form a resin film (also referred to as a resin layer or a liquid film);

(iii) a process in which the resin film is heated on the support to form a self-supportive gel film and thereafter, the gel film is peeled off from the support;

(iv) a process in which the gel film is further heated to imidize remaining amic acid and to dry the gel film, and the non-thermoplastic polyimide film is obtained.

Subsequent processes of the process (ii) are roughly divided into a thermal imidization method and a chemical imidization method. The thermal imidization method is a method in which imidization is performed by only casting a polyamic acid solution as a film-forming dope to a support and applying heat thereto without using a dehydrating ring closure agent or the like. On the other hand, the chemical imidization method is a method in which a mixture obtained by adding at least one of a dehydrating ring closure agent and a catalyst as an imidization promoter to a polyamic acid solution is used as a film-forming dope to promote imidization. Either method may be used. However, the chemical imidization method is superior in productivity.

As the dehydrating ring closure agent, an acid anhydride represented by an acetic anhydride can be suitably used. As the catalyst, a tertiary amine such as an aliphatic tertiary amine, an aromatic tertiary amine, a heterocyclic tertiary amine can be suitably used.

As the support for casting a film-forming dope, a glass plate, an aluminum foil, an endless stainless steel belt, a stainless drum or the like can be suitably used. A heating condition of the film-forming dope is set according to a thickness of a finally obtained film and a production speed, and after at least one of imidization and drying is partially performed with respect to the film-forming dope, a polyamic acid film (hereinafter, referred to as a gel film) is obtained by peeling off the film from the support.

The gel film is dried by fixing edge portions of the gel film to avoid contraction during curing. Water and any residual solvent and imidization promoter are removed from the gel film, and remaining amic acid is completely imidized, and a film containing the polyimide is obtained. The heating condition may be set as appropriate according to the thickness of the finally obtained film and the production speed.

(Manufacture of Polyimide Laminated Film)

As methods for manufacturing the polyimide laminated film of the present invention, it is possible that, in the above process (ii), multiple resin films containing the thermoplastic polyamic acid and the non-thermoplastic polyamic acid are simultaneously formed using a coextrusion die having multiple flow paths, and it is also possible that the non-thermoplastic polyamic acid is synthesized in the above process (i) and thereafter, the above processes (ii)-(iv) are performed and the non-thermoplastic polyimide film is temporarily collected, and thereafter, a resin film containing the thermoplastic polyamic acid is newly formed on the non-thermoplastic polyimide film by coating or the like. Since imidization requires a very high temperature, when a resin film other than a polyimide film is provided, it is preferable to adopt the latter method in order to suppress thermal decomposition. When a thermoplastic polyimide layer is provided by coating, it is possible that the thermoplastic polyamic acid is applied on the non-thermoplastic polyimide film, and thereafter, imidization is performed, and it is also possible that a thermoplastic polyimide solution capable of forming a thermoplastic polyimide layer is applied and dried on the non-thermoplastic polyimide film.

By laminating the polyimide laminated film of the present invention and a metal foil, a flexible metal clad laminate processed into an FPC can be manufactured. Examples of methods for forming a polyimide laminated film on a metal foil includes:

(a) a method (thermal lamination method) in which, as described above, after a polyimide laminated film is obtained, a metal foil is bonded to the polyimide laminated film by applying heat and pressure, and thereby a flexible metal clad laminate is obtained;

(b) a method (cast method) in which multiple layers of an organic solvent solution containing at least one of a thermoplastic polyamic acid solution and a non-thermoplastic polyamic acid solution are cast on a metal foil, and the solvent is removed from the organic solvent solution by heating, and imidization is performed, and thereby a flexible metal clad laminate is obtained; and (c) a method (cast method) in which a melt liquid containing polyimide of at least one of a thermoplastic polyimide acid solution and a non-thermoplastic polyimide acid solution is cast on a metal foil and the melt liquid is cooled, and thereby, a flexible metal clad laminate is obtained.

Among these methods, since there is a possibility that a solder heat resistance, a heat shrinkage rate and the like of the resulting flexible metal clad laminate may deteriorate when the polyimide is meltable, it is preferable to use the method (a) or (b). When the polyimide is solvent-soluble, an organic solvent solution containing the polyimide may be used in place of the organic solvent solution containing the polyamic acid. Details of the methods (a) and (b) are described below.

In the method (a), the flexible metal clad laminate of the present invention is obtained by thermal lamination in which a metal foil is bonded to an obtained polyimide film by applying heat and pressure. A method and a condition for bonding the metal foil may be suitably selected from conventionally known methods and conditions.

In the method (b), a method for casting an organic solvent solution containing a polyamic acid on a metal foil is not particularly limited, and conventionally known methods such as a die coater or a comma coater (registered trademark), a reverse coater, and a knife coater can be used.

Conventional known methods can also be used for removing a solvent and performing imidization. For example, a hot air furnace or a far infrared furnace can be used. Similar to the method (a), heating time can be shortened and productivity can be improved by using a chemical imidization method. However, since an acid is generated in the process of imidization from an acid anhydride that is a dehydrating ring closure agent, depending on a type of the metal foil, oxidation may progress. It is preferable to suitably select a dehydrating ring closure agent to be added according to a type of the metal foil and a heating condition. In a case where multiple polyimide resin films are provided such as the case where the thermoplastic polyimide layer and the non-thermoplastic polyimide film of the present invention are provided, or in a case where a resin film other than a polyimide film is also provided, a method can be preferably used in which the above casting and heating processes are repeated multiple times or multiple cast layers are formed by coextrusion or continuous casting and are heated at once. In the method (b), when the imidization is completed, the flexible metal clad laminate is obtained. When a metal foil is provided on both sides of a resin film, a metal foil may be bonded to a surface of the resin film on an opposite side by applying heat and pressure.

The metal foil is not particularly limited and any metal foil can be used. For example, copper, stainless steel, nickel, aluminum, alloys of these metals, and the like can be suitably used. Further, copper such as rolled copper or electrolytic copper is frequently used in a general metal clad laminate, and can also be preferably used in the present invention.

Further, as the metal foil, depending on a purpose, a metal foil that has been subjected to a surface treatment, or a metal foil having various characteristics such as having a roughened surface, can be selected. Further, on a surface of the metal foil, an anti-corrosion layer, a heat-resistant layer or an adhesive layer may be applied. A thickness of the metal foil is not particularly limited. Depending on an intended use, the metal foil may have any thickness as long as a sufficient functionality is achieved.

A total thickness of the polyimide laminated film according to the present invention is preferably 7 μm-60 μm. Even in this range, a smaller thickness of the polyimide laminated film is preferable in that flexibility of the FPC is improved. However, when the thickness of the polyimide laminated film is less than 7 μm, handling during processing may be difficult. When the thickness of the polyimide laminated film exceeds 60 μm, flexibility of the FPC may decrease and reduction in a thickness of the FPC may be difficult.

EXAMPLES

In the following, the present invention is described in detail based on examples. However, the present invention is not limited to only these examples.

Table 1 shows measurement results of Synthesis Examples 1-9, and Table 2 shows measurement results of Examples 1-4 and Comparative Examples 1-5.

(Dynamic Viscoelasticity Measurement (DMA))

For the storage elastic modulus, the dynamic viscoelasticity was measured in an air atmosphere using a DMS6100 manufactured by SII NanoTechnology, and a graph was prepared in which tan δ was plotted against measurement temperature, and the storage elastic modulus at 380° C. was read from the graph. Storage elastic moduli of the thermoplastic polyimide layers of Synthesis Examples 1-9 and storage elastic moduli of stand-alone blocks (A) and blocks (B) of the thermoplastic polyimide layers of Synthesis Examples 1-4, 8, 9 were measured. The glass transition temperature (Tg (° C.)) was a peak top temperature of the loss factor (tan δ) obtained by dividing the loss modulus by the storage elastic modulus.

Sample measurement range: Width: 9 mm; distance between jaws: 20 mm
Measurement temperature range: 0° C.-440° C.
Rate of temperature increase: 3° C./minute
Strain amplitude: 10 μm
Measurement frequency: 5 Hz
(Minimum tension)/(compression force): 100 mN
Tension/(compression gain): 1.5
Force amplitude initial value: 100 mN (Weight Reduction Rate Measurement)

Three pieces of films each cut into 3 cm×7 cm were prepared and were heated at 50° C. for 30 minutes, and thereafter, an initial weight (W0) was measured. Each sample was immersed for 10 minutes in a 3% aqueous sodium hydroxide solution heated to 80° C. After the immersion, the sample was washed with pure water, and was dried at 50° C. for 30 minutes. Thereafter, a weight (W1) was measured. A weight reduction rate was obtained using the following formula.

Weight reduction rate (%)=($W0-W1$)/$W0$×100

(Presence or Absence of Crack)

Crack resistance (specifically, presence or absence of a crack) of a flexible metal foil laminate when immersed in a desmear liquid was evaluated using the following method.

Figure 1:
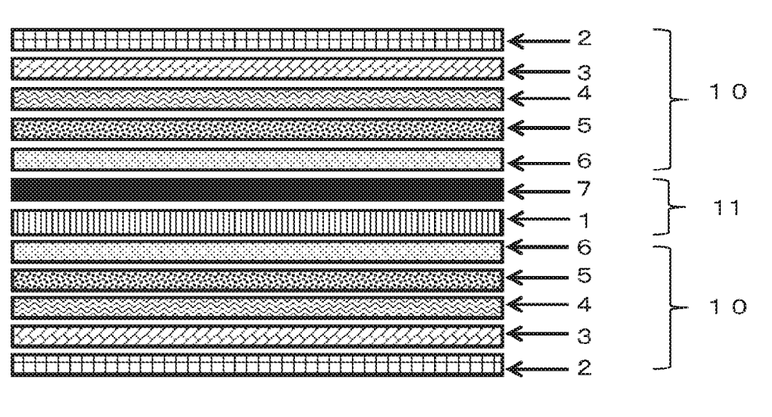
FIG. 1 illustrates a method for measuring crack resistance of a flexible metal foil laminate in examples when the flexible metal foil laminate is immersed in a desmear liquid.

Laminates each having a length of 20 cm in a longitudinal direction and a width of 25 cm were respectively cut from the flexible metal foil laminates obtained in the examples and the comparative examples. A metal foil layer on one side of each of the cut laminates was etched, and a pattern having a wiring width of 250 μm and a wiring interval of 250 μm was formed. A metal foil on the other side of each of the cut laminates where a pattern was not formed was completely removed. A test piece having a length of 10 cm in a longitudinal direction and a width of 1.5 cm was cut out, the longitudinal direction being a direction parallel to a direction along which a wiring extends. This test piece was sandwiched between cushioning materials as illustrated in FIG. 1 and was subjected to hot pressing (first hot pressing) for 60 minutes at 180° C. and 3.8 kgf/cm².

Subsequently, a central portion of 1 cm×10 cm in dimensions of an FR4 substrate (glass epoxy substrate having a thickness of 0.4 mm) of 10 cm×12 cm in dimensions was hollowed out, and a double-sided tape was affixed to an edge portion. The test piece after the hot pressing was arrange in the opening of the FR4 substrate such that an edge of the test piece overlapped the double-sided tape, and hot pressing (second hot pressing) was performed for 60 minutes at 180° C. and 30 kgf/cm².

After the second hot pressing, the test piece was cut off from the FR4 substrate, and was sequentially immersed in a swelling liquid (Securigant P, manufactured by Atotech Corporation) kept at 50° C. for 90 seconds, in a desmear liquid (Securigant P500 P-Etch, manufactured by Atotech Corporation) kept at 65° C. for 300 seconds, and in a neutralizing solution (Securigant P500, manufactured by Atotech Corporation) kept at 40° C. for 40 seconds. After the immersion, the test piece was washed with water, and thereafter, was dried at 60° C. for 10 minutes, and thereby, a dried test piece was obtained.

With respect to the dried test piece, a portion overlapped the FR4 substrate during the second hot pressing was observed under an optical microscope, and presence or absence of a crack was confirmed. A sign "Excellent" was used to indicate a case where a crack was not confirmed; a sign "Good" was used to indicate a case where, although a crack was confirmed, a size (in a longitudinal direction) of the crack is less than 1 µm; and a sign "Poor" was used to indicate a case where a crack was confirmed. A crack (break, rupture) confirmed using an optical microscope was considered as a crack regardless of its size. A magnification of the optical microscope was set to an optimum magnification for judging a portion considered to be a crack.

(Peel Strength Measurement Method)

An electrolytic copper foil (3EC-M3 S-HTE (K), manufactured by Mitsui Metal Co., Ltd.) having a thickness of 12 µm was arranged on both sides of a prepared multilayer polyimide film, and was thermocompression-bonded thereto at a lamination temperature of 360° C. under a pressure of 0.8 t and at a line speed of 1 m/min. A sample composed of the copper foil and the polyimide film was analyzed according to "6.5 Peel Strength" of JIS C6471. Specifically, a metal foil portion having a width of 1 mm was peeled at peeling angle of 90 degrees and a speed of 100 mm/minute, and a load thereof was measured. A sign "Good" was used to indicate a case where the peel strength is 12 N/cm or more, and a sign "Poor" was used to indicate a case where the peel strength is less than 12 N/cm.

Synthesis of Thermoplastic Polyimide Precursor

Synthesis Example 1

In a state in which inside of a reaction system is maintained at 20° C., 4.87 kg of 4,4'-bis (4-aminophenoxy) biphenyl (hereinafter also referred to as BAPB) was added to 167.7 kg of N,N-dimethylacetamide (hereinafter also referred to as DMF), and, while stirring in a nitrogen atmosphere, 3.24 kg of 3,3',4,4'-biphenyltetracarboxylic acid dianhydride (hereinafter also referred to as BPDA) was gradually added. After visually confirming that BPDA had dissolved, 12.67 kg of 2,2'-bis [4-(4-aminophenoxy) phenyl] propane (hereinafter also referred to as BAPP) was added. Subsequently, 6.88 kg of pyromellitic dianhydride (hereinafter also referred to as PMDA) was added and stirring was performed for 30 minutes. A solution obtained by dissolving 0.7 kg of PMDA in DMF such that a solid component concentration is 7% was prepared. While paying attention to an increase in viscosity, this solution was gradually added to the above reaction solution, and polymerization was terminated when the viscosity reached 300 poise (Block (A): BAPB-BPDA; Block (B): BAPP-PMDA).

Synthesis Example 2

In a state in which inside of a reaction system is maintained at 20° C., 6.78 kg of 4,4'-diaminodiphenyl ether (hereinafter also referred to as ODA) was added to 172.0 kg of DMF, and, while stirring in a nitrogen atmosphere, 9.19 kg of BPDA was gradually added. After visually confirming that BPDA had dissolved, 7.48 kg of BAPP was added. Subsequently, 4.15 kg of PMDA was added and stirring was performed for 30 minutes. A solution obtained by dissolving 0.7 kg of PMDA in DMF such that a solid component concentration is 7% was prepared. While paying attention to an increase in viscosity, this solution was gradually added to the above reaction solution, and polymerization was terminated when the viscosity reached 300 poise (Block (A): ODA-BPDA; Block (B): BAPP-PMDA).

Synthesis Example 3

In a state in which inside of a reaction system is maintained at 20° C., 5.04 kg of BAPB was added to 172.0 kg of DMF, and, while stirring in a nitrogen atmosphere, 3.35 kg of BPDA was gradually added. After visually confirming that BPDA had dissolved, 11.23 kg of BAPP and 0.91 kg of ODA were added. Subsequently, 7.11 kg of PMDA was added and stirring was performed for 30 minutes. A solution obtained by dissolving 0.7 kg of PMDA in DMF such that a solid component concentration is 7% was prepared. While paying attention to an increase in viscosity, this solution was gradually added to the above reaction solution, and polymerization was terminated when the viscosity reached 300 poise (Block (A): BAPB-BPDA; block (B): BAPP-ODA-PMDA).

Synthesis Example 4

In a state in which inside of a reaction system is maintained at 20° C., 7.49 kg of BAPB and 1.36 kg of ODA were added to 172.0 kg of DMF, and, while stirring in a nitrogen atmosphere, 7.31 kg of BPDA was gradually added. After visually confirming that BPDA had dissolved, 7.42 kg of BAPP was added. Subsequently, 4.09 kg of PMDA was added and stirring was performed for 30 minutes. A solution obtained by dissolving 0.7 kg of PMDA in DMF such that a solid component concentration is 7% was prepared. While paying attention to an increase in viscosity, this solution was gradually added to the above reaction solution, and polymerization was terminated when the viscosity reached 300 poise (Block (A): BAPB-ODA-BPDA; Block (B): BAPP-PMDA).

Synthesis Example 5

In a state in which inside of a reaction system is maintained at 20° C., 12.43 kg of BPDA was added to 172.0 kg of DMF, and, while stirring in a nitrogen atmosphere, 15.02 kg of BAPB was gradually added, and stirring was performed for 30 minutes. A solution obtained by dissolving 0.7 kg of BAPB in DMF such that a solid component concentration is 7% was prepared. While paying attention to an increase in viscosity, this solution was gradually added to the above reaction solution, and polymerization was terminated when the viscosity reached 300 poise Block (B): none).

Synthesis Example 6

In a state in which inside of a reaction system is maintained at 20° C., 18.28 kg of BAPP was added to 172.0 kg of DMF, and, while stirring in a nitrogen atmosphere, 9.38 kg of PMDA was gradually added, and stirring was performed for 30 minutes. A solution obtained by dissolving 0.7 kg of PMDA in DMF such that a solid component concentration is 7% was prepared. While paying attention to an increase in viscosity, this solution was gradually added to the above reaction solution, and polymerization was terminated when the viscosity reached 300 poise (Block (A): none).

Synthesis Example 7

In a state in which inside of a reaction system is maintained at 20° C., 4.87 kg of BAPB and 12.67 kg of BAPP were added to 172.0 kg of DMF. Stirring was performed in a nitrogen atmosphere, and dissolution of BAPB and BAPP was confirmed. 3.24 kg of BPDA and 6.88 kg of PMDA were added and stirring was performed for 30 minutes. A solution obtained by dissolving 0.7 kg of PMDA in DMF such that a solid component concentration is 7% was prepared. While paying attention to an increase in viscosity, this solution was gradually added to the above reaction solution, and polymerization was terminated when the viscosity reached 300 poise (Block (A); Block (B): none).

Synthesis Example 8

In a state in which inside of a reaction system is maintained at 20° C., 8.85 kg of BAPB was added to 167.6 kg of DMF, and, while stirring in a nitrogen atmosphere, 6.36 kg of BPDA was gradually added. After visually confirming that BPDA had dissolved, 7.02 kg of 1,3-bis (4-aminophenoxy) benzene (hereinafter also referred to as TPE-R) was added. Subsequently, 5.45 kg of PMDA was added and stirring was performed for 30 minutes. A solution obtained by dissolving 0.7 kg of PMDA in DMF such that a solid component concentration is 7% was prepared. While paying attention to an increase in viscosity, this solution was gradually added to the above reaction solution, and polymerization was terminated when the viscosity reached 300 poise (Block (A): BAPB-BPDA; Block (B): TPE-R-PMDA).

Synthesis Example 9

In a state in which inside of a reaction system is maintained at 20° C., 5.03 kg of 3,4'-diaminodiphenyl ether (hereinafter also referred to as 3,4'-ODA) was added to 167.4 kg of DMF, and, while stirring in a nitrogen atmosphere, 6.65 kg of BPDA was gradually added. After visually confirming that BPDA had dissolved, 10.30 kg of BAPP was added. Subsequently, 5.69 kg of PMDA was added and stirring was performed for 30 minutes. A solution obtained by dissolving 0.7 kg of PMDA in DMF such that a solid component concentration is 7% was prepared. While paying attention to an increase in viscosity, this solution was gradually added to the above reaction solution, and polymerization was terminated when the viscosity reached 300 poise (Block (A): 3,4'-ODA-BPDA; Block (B): BAPP-PMDA).

Synthesis and Film of Non-Thermoplastic Polyimide Precursor

Synthesis Example 10

In a state in which inside of a reaction system is maintained at 20° C., 5.50 kg of ODA and 2.82 kg of BAPP were added to 170.0 kg of DMF and the mixture was stirred in a nitrogen atmosphere. After visually confirming that ODA and BAPP had dissolved, 4.43 kg of BTDA was added. After visually confirming that BTDA had dissolved, 7.79 kg of PMDA was added. After confirming that PMDA had dissolved, stirring was performed for 30 minutes. 3.42 kg of p-PDA and 0.55 kg of ODA were added. After visually confirming that p-PDA and ODA had dissolved, 7.79 kg of PMDA was gradually added and the mixture was stirred for 30 minutes.

Finally, a solution obtained by dissolving 0.8 kg of BAPP in DMF such that a solid component concentration is 7% was prepared. While paying attention to an increase in viscosity, this solution was gradually added to the above reaction solution, and polymerization was terminated when the viscosity reached 3000 poise.

An imidization promoter composed of acetic anhydride, isoquinoline and DMF (weight ratios: acetic anhydride/isoquinoline/DMF=2.0/0.6/2.8) was added to the polyamic acid solution at a weight ratio of 50% with respect to the polyamic acid solution, and the mixture was continuously stirred using a mixer. The mixture was extruded from a T die and was cast on a stainless steel endless belt. This resin film was heated at 130° C. for 100 seconds, and thereafter, a self-supportive gel film was peeled off from the endless belt. The gel film was fixed to a tenter clip, and was dried and imidized at 250° C. for 15 seconds and at 350° C. for 87 seconds, and a polyimide film having a thickness of 12.5 μm was obtained.

Example 1

The polyamic acid solution obtained in Synthesis Example 1 was applied on both sides of the polyimide film obtained in Synthesis Example 10 such that a final thickness per one side was 3.0 μm, and drying was performed at 140° C. for 2 minutes. Subsequently, imidization was performed by heating at 350° C. for 1 minute, and a polyimide laminated film having a total thickness of 18.5 μm was obtained.

An electrolytic copper foil (3EC-M3 S-HTE manufactured by Mitsui Metal Co., Ltd.) having a thickness of 12.5 μm was arranged on both sides of the obtained polyimide laminated film. Further, a protective film (Apical 125 NPI manufactured by Kaneka Corporation having a thickness of 125 μm) is arranged on both sides of the electrolytic copper foil. Thermal lamination was performed from an outer side of the protective film at a laminating temperature of 360° C. under a laminating pressure of 265 N/cm (27 kgf/cm) and at a lamination speed of 1.0 m/min. Thereby, a flexible metal foil laminate was produced.

Example 2

A flexible metal foil laminate was produced by performing the same operation as in Example 1 except that the polyimide film obtained in Synthesis Example 2 was used in place of the polyimide film obtained in Synthesis Example 1.

Example 3

A flexible metal foil laminate was produced by performing the same operation as in Example 1 except that the polyimide film obtained in Synthesis Example 3 was used in place of the polyimide film obtained in Synthesis Example 1.

Example 4

A flexible metal foil laminate was produced by performing the same operation as in Example 1 except that the polyimide film obtained in Synthesis Example 4 was used in place of the polyimide film obtained in Synthesis Example 1.

Comparative Example 1

A flexible metal foil laminate was produced by performing the same operation as in Example 1 except that the polyimide film obtained in Synthesis Example 5 was used in place of the polyimide film obtained in Synthesis Example 1.

Comparative Example 2

A flexible metal foil laminate was produced by performing the same operation as in Example 1 except that the polyimide film obtained in Synthesis Example 6 was used in place of the polyimide film obtained in Synthesis Example 1.

Comparative Example 3

A flexible metal foil laminate was produced by performing the same operation as in Example 1 except that the polyimide film obtained in Synthesis Example 7 was used in place of the polyimide film obtained in Synthesis Example 1.

Comparative Example 4

A flexible metal foil laminate was produced by performing the same operation as in Example 1 except that the polyimide film obtained in Synthesis Example 8 was used in place of the polyimide film obtained in Synthesis Example 1.

Comparative Example 5

A flexible metal foil laminate was produced by performing the same operation as in Example 1 except that the polyimide film obtained in Synthesis Example 9 was used in place of the polyimide film obtained in Synthesis Example 1.

REFERENCE EXAMPLES

In the following, synthesis examples of polyamic acids and manufacturing examples of films for measuring storage elastic moduli of the blocks (A) and the blocks (B) of Synthesis Examples 1-4, 8, 9 are described. The block (A) alone or the block (B) alone of each of Synthesis Examples 1-4, 8, 9 was used in an equimolar amount to obtain a polyamic acid solution. An imidization promoter composed of acetic anhydride, isoquinoline and DMF (weight ratios: acetic anhydride/isoquinoline/DMF=2.0/0.6/2.8) was added to the polyamic acid solution at a weight ratio of 50% with respect to the polyamic acid solution, and the mixture was continuously stirred using a mixer. The mixture was extruded from a T die and was cast on a stainless steel endless belt. This resin film was heated at 130° C. for 100 seconds, and thereafter, a self-supportive gel film was peeled off from the endless belt. The gel film was fixed to a tenter clip, and was dried and imidized at 250° C. for 15 seconds and at 300° C. for 87 seconds, and a polyimide film having a thickness of 12.5 μm was obtained. Viscoelasticity measurement results of these thermoplastic polyimide films are also shown in Table 1

TABLE 1

| Synthesis Example | | Storage Elastic Modulus (GPa) at 380° C. | | Thermoplastic polyimide layer | Tg (° C.) |
|---|---|---|---|---|---|
| | | Block A | Block B | | |
| 1 | BAPB (30)/BPDA (25)//BAPP (70)/PMDA (75) | 0.16 | 0.05 | 0.04 | 280 |
| 2 | ODA (65)/BPDA (60)//BAPP (35)/PMDA (40) | 0.23 | 0.05 | 0.01 | 273 |
| 3 | BAPB (30)/BPDA (25)//BAPP (70)/ODA (10)/PMDA (75) | 0.16 | 0.07 | 0.00 | 290 |
| 4 | BAPB (45)/ODA (15)/BPDA (55)//BAPP (40)/PMDA (45) | 0.18 | 0.05 | 0.01 | 250 |
| 5 | BAPB (100)/BPDA (100) | — | — | 0.16 | 230 |
| 6 | BAPP (100)/PMDA (100) | — | — | 0.05 | 295 |
| 7 | BAPB (30)/BAPP (70)/BPDA (25)/PMDA (75) | — | — | 0.01 | 265 |
| 8 | BAPB (50)/BPDA (45)//TPE-R (50)/PMDA (55) | 0.16 | 0.22 | 0.03 | 240 |
| 9 | 3,4'-ODA (50)/BPDA (45)//BAPP (50)/PMDA (55) | 0.07 | 0.05 | 0.01 | 270 |

TABLE 2

| | Thermoplastic Polyimide Layer | Weight Reduction Rate (%) | Crack | Peel Strength (N/cm) |
|---|---|---|---|---|
| Example 1 | Synthesis Example 1 | 1.7 | Excellent | 13 |
| Example 2 | Synthesis Example 2 | 1.5 | Good | 12 |
| Example 3 | Synthesis Example 3 | 1.6 | Excellent | 14 |
| Example 4 | Synthesis Example 4 | 1.5 | Excellent | 14 |
| Comparative Example 1 | Synthesis Example 5 | 1.3 | Good | 5 |
| Comparative Example 2 | Synthesis Example 6 | 2.5 | Poor | 14 |
| Comparative Example 3 | Synthesis Example 7 | 2.2 | Poor | 12 |
| Comparative Example 4 | Synthesis Example 8 | 2.3 | Poor | 7 |
| Comparative Example 5 | Synthesis Example 9 | 3 | Poor | 7 |

INDUSTRIAL APPLICABILITY

The present invention can be used in fields where a flexible printed wiring board is manufactured.

DESCRIPTION OF REFERENCE NUMERALS

1: polyimide laminated film
2: non-woven fabric
3: metal plate
4: kraft
5: vinyl chloride resin film
6: release film
7: electrolytic copper foil
10: laminated material (2, 3, 4, 5, 6)
11: flexible metal foil laminate

What is claimed is:

1. A polyimide laminated film, comprising:
at least one thermoplastic polyimide layer comprising a thermoplastic polyimide that comprises a block (A) having a storage elastic modulus of 0.15 GPa or more at 380° C. and a block (B) having a storage elastic modulus of 0.10 GPa or less at 380° C., and
a non-thermoplastic polyimide film,
wherein the at least one thermoplastic polyimide layer is present on at least one surface of the non-thermoplastic polyimide film,
wherein the block (A) comprises 4,4'-bis (4-aminophenoxy) biphenyl (BAPB), 4,4'-diaminodiphenyl ether (ODA), and 3,3',4,4'-biphenyltetracarboxylic dianhydride (BPDA),
wherein the block (B) comprises a combination of (i) at least one diamine selected from the group consisting of 2,2'-bis [4-(4-aminophenoxy) phenyl] propane (BAPP) and 4,4'-diaminodiphenyl ether (ODA), and (ii) an acid dianhydride, which is pyromellitic dianhydride (PMDA), and
wherein an amount of the block (A) is from 30 mol % to 70 mol % and an amount of the block (B) is from 30 mol % to 70 mol %, based on a total molar amount of the thermoplastic polyimide.

2. The polyimide laminated film according to claim 1 having a weight reduction rate of less than 2 weight % when immersed in an alkaline solution at 80° C. for 10 minutes.

3. The polyimide laminated film according to claim 2, wherein the at least one thermoplastic polyimide layer has a storage elastic modulus of 0.05 GPa or less at 380° C.

4. The polyimide laminated film according to claim 1, wherein the at least one thermoplastic polyimide layer has a storage elastic modulus of 0.05 GPa or less at 380° C.

5. The polyimide laminated film according to claim 1, wherein the at least one thermoplastic polyimide layer has a storage elastic modulus of 0.04 GPa or less at 380° C.

6. The polyimide laminated film according to claim 1, wherein the at least one thermoplastic polyimide layer comprises a plurality of thermoplastic polyimide layers, and the non-thermoplastic polyimide film is positioned between the thermoplastic polyimide layers.

7. A method for manufacturing a thermoplastic polyimide, the method comprising:
copolymerizing a block (A) having a storage elastic modulus of 0.15 GPa or more at 380° C. and a block (B) having a storage elastic modulus of 0.10 GPa or less at 380° C.,
wherein the block (A) comprises 4,4'-bis (4-aminophenoxy) biphenyl (BAPB), 4,4'-diaminodiphenyl ether (ODA), and 3,3',4,4'-biphenyltetracarboxylic dianhydride (BPDA),
wherein the block (B) comprises a combination of (i) at least one diamine selected from the group consisting of 2,2'-bis [4-(4-aminophenoxy) phenyl] propane (BAPP) and 4,4'-diaminodiphenyl ether (ODA), and (ii) an acid dianhydride, which is pyromellitic dianhydride (PMDA), and
wherein an amount of the block (A) is from 30 mol % to 70 mol % and an amount of the block (B) is from 30 mol % to 70 mol %, based on a total molar amount of the thermoplastic polyimide.

8. The method according to claim 7, wherein the block (B) comprises 2,2'-bis [4-(4-aminophenoxy) phenyl] propane (BAPP) and pyromellitic dianhydride (PMDA).

9. A method for manufacturing a polyimide laminated film, the method comprising:
laminating at least one thermoplastic polyimide layer and a non-thermoplastic polyimide layer,
wherein the at least one thermoplastic polyimide layer comprises a polyimide comprising a block (A) having a storage elastic modulus of 0.15 GPa or more at 380° C. and a block (B) having a storage elastic modulus of 0.10 GPa or less at 380° C.,
wherein the block (A) comprises 4,4'-bis (4-aminophenoxy) biphenyl (BAPB), 4,4'-diaminodiphenyl ether (ODA), and 3,3',4,4'-biphenyltetracarboxylic dianhydride (BPDA),
wherein the block (B) comprises a combination of (i) at least one diamine selected from the group consisting of 2,2'-bis [4-(4-aminophenoxy) phenyl] propane (BAPP) and 4,4'-diaminodiphenyl ether (ODA), and (ii) an acid dianhydride, which is pyromellitic dianhydride (PMDA), and
wherein an amount of the block (A) is from 30 mol % to 70 mol % and an amount of the block (B) is from 30 mol % to 70 mol %, based on a total molar amount of the thermoplastic polyimide.

10. The method according to claim 9, wherein the block (B) comprises 2,2'-bis [4-(4-aminophenoxy) phenyl] propane (BAPP) and pyromellitic dianhydride (PMDA).

11. A method for manufacturing a flexible metal clad laminate, comprising:
laminating a metal foil and the polyimide laminated film of claim 1.

12. The method according to claim 11, wherein the laminating is performed by a thermal lamination method or a cast method.

13. The method according to claim 11, wherein the block (B) comprises 2,2'-bis [4-(4-aminophenoxy) phenyl] propane (BAPP) and pyromellitic dianhydride (PMDA).

* * * * *